US009738787B2

(12) United States Patent
Yun et al.

(10) Patent No.: US 9,738,787 B2
(45) Date of Patent: Aug. 22, 2017

(54) COMPOSITION FOR FORMING SILICA-BASED INSULATING LAYER, METHOD FOR PREPARING COMPOSITION FOR FORMING SILICA-BASED INSULATING LAYER, SILICA-BASED INSULATING LAYER, AND METHOD FOR MANUFACTURING SILICA-BASED INSULATING LAYER

(71) Applicant: CHEIL INDUSTRIES INC., Gumi-si, Gyeongsangbuk-do (KR)

(72) Inventors: Hui-Chan Yun, Suwon-si (KR); Taek-Soo Kwak, Suwon-si (KR); Mi-Young Kim, Suwon-si (KR); Sang-Hak Lim, Suwon-si (KR); Kwen-Woo Han, Suwon-si (KR); Go-Un Kim, Suwon-si (KR); Bong-Hwan Kim, Suwon-si (KR); Sang-Kyun Kim, Suwon-si (KR); Yoong-Hee Na, Suwon-si (KR); Eun-Su Park, Suwon-si (KR); Jin-Hee Bae, Suwon-si (KR); Hyun-Ji Song, Suwon-si (KR); Han-Song Lee, Suwon-si (KR); Seung-Hee Hong, Suwon-si (KR)

(73) Assignee: CHEIL INDUSTRY, INC., Gumi-Si, Gyeongsangbuk-Do (KR)

( * ) Notice: Subject to any disclaimer, the term of this patent is extended or adjusted under 35 U.S.C. 154(b) by 325 days.

(21) Appl. No.: 14/432,401

(22) PCT Filed: Aug. 16, 2013

(86) PCT No.: PCT/KR2013/007377
§ 371 (c)(1),
(2) Date: Mar. 30, 2015

(87) PCT Pub. No.: WO2014/104528
PCT Pub. Date: Jul. 3, 2014

(65) Prior Publication Data
US 2015/0274980 A1 Oct. 1, 2015

(30) Foreign Application Priority Data

Dec. 27, 2012 (KR) .................. 10-2012-0155327

(51) Int. Cl.
C08G 77/54 (2006.01)
B05D 3/02 (2006.01)
B05D 3/04 (2006.01)
C09D 1/00 (2006.01)
H01B 3/46 (2006.01)
C08G 77/62 (2006.01)
C09D 183/14 (2006.01)
C09D 183/16 (2006.01)
H01B 3/30 (2006.01)
H01B 3/02 (2006.01)
H01L 21/02 (2006.01)

(52) U.S. Cl.
CPC ................ *C09D 1/00* (2013.01); *B05D 3/02* (2013.01); *B05D 3/0254* (2013.01); *B05D 3/0433* (2013.01); *C08G 77/62* (2013.01); *C09D 183/14* (2013.01); *C09D 183/16* (2013.01); *H01B 3/02* (2013.01); *H01B 3/303* (2013.01); *H01B 3/46* (2013.01); *H01L 21/02126* (2013.01); *H01L 21/02164* (2013.01); *H01L 21/02214* (2013.01); *H01L 21/02216* (2013.01); *H01L 21/02219* (2013.01); *H01L 21/02222* (2013.01); *H01L 21/02282* (2013.01); *H01L 21/02326* (2013.01); *H01L 21/02337* (2013.01)

(58) Field of Classification Search
None
See application file for complete search history.

(56) References Cited

U.S. PATENT DOCUMENTS

| 2004/0161944 | A1 | 8/2004 | Hong et al. | |
| 2004/0224537 | A1* | 11/2004 | Lee ................ | C09D 183/16 438/782 |
| 2010/0112749 | A1 | 5/2010 | Park et al. | |
| 2010/0234540 | A1 | 9/2010 | Ozaki | |
| 2016/0176718 | A1* | 6/2016 | Jang ................ | C01B 33/12 423/335 |

FOREIGN PATENT DOCUMENTS

| CN | 1386391 A | 12/2002 |
| CN | 101835847 A | 9/2010 |
| CN | 102585516 A | 7/2012 |
| JP | 08-269399 A * | 10/1996 |
| JP | 10-046108 A | 2/1998 |
| JP | 11-116815 A | 4/1999 |
| JP | 3208040 B2 | 9/2001 |
| JP | 2001-308090 A | 11/2001 |
| JP | 3479648 B2 | 12/2003 |
| JP | 3516815 B2 | 4/2004 |
| JP | 2008-140896 A | 6/2008 |
| JP | 2012-197442 A | 10/2012 |

(Continued)

OTHER PUBLICATIONS

Machine translation of JP 08-269399 into English (no date).*

(Continued)

*Primary Examiner* — Marc Zimmer
(74) *Attorney, Agent, or Firm* — Lee & Morse, P.C.

(57) ABSTRACT

Disclosed is a composition for a silica-based insulation layer including hydrogenated polysilazane or hydrogenated polysiloxane, wherein a concentration of a cyclic compound having a weight average molecular weight of less than 400 is less than or equal to 1,200 ppm. The composition for a silica-based insulation layer may reduce a thickness distribution during formation of a silica-based insulation layer, and thereby film defects after chemical mechanical polishing (CMP) during a semiconductor manufacturing process may be reduced.

9 Claims, No Drawings

(56) References Cited

FOREIGN PATENT DOCUMENTS

| | | |
|---|---|---|
| KR | 10-2004-0072382 A | 8/2001 |
| KR | 10-2003-0030736 A1 | 4/2003 |
| KR | 10-2004-0068989 A | 8/2004 |
| KR | 10-2007-0044051 A | 4/2007 |
| KR | 10-0909215 B1 | 7/2009 |
| KR | 10-0914395 B1 | 8/2009 |
| KR | 10-2010-0100820 A | 9/2010 |
| KR | 10-2011-0012581 A | 2/2011 |
| KR | 10-2011-0062158 A | 6/2011 |
| KR | 10-2011-0081043 A | 7/2011 |
| KR | 10-2012-0071311 A | 7/2012 |
| KR | 10-2012-0080383 A | 7/2012 |
| TW | 200932811 A | 8/2009 |
| WO | WO 2012/039357 A1 | 3/2012 |
| WO | WO 2013/118642 * | 8/2013 |

OTHER PUBLICATIONS

Taiwanese Search Report for 102146789 dated Apr. 13, 2015; Yun, et al.
Chinese Search Report dated Feb. 15, 2016 for corresponding Chinese Patent Application No. 201380044747.0.

* cited by examiner

COMPOSITION FOR FORMING SILICA-BASED INSULATING LAYER, METHOD FOR PREPARING COMPOSITION FOR FORMING SILICA-BASED INSULATING LAYER, SILICA-BASED INSULATING LAYER, AND METHOD FOR MANUFACTURING SILICA-BASED INSULATING LAYER

BACKGROUND OF THE INVENTION (a) Field of the Invention

This disclosure relates to a composition for a silica-based insulation layer and a method for manufacturing the same, and a silica-based insulation layer using the same, and a method for manufacturing the same.

(b) Description of the Related Art

As semiconductor technology is increasingly developed, there is continuous research on forming highly-integrated and faster semiconductor memory cells that have improved performance and integrate smaller semi-conductor chips. Particularly, among these semiconductor memory cells, e.g., DRAM (dynamic random access memory) may be used.

The DRAM is capable of freely inputting and outputting information, and may realize large capacity. The DRAM may include, e.g., a plurality of unit cells including one MOS transistor and one capacitor. The capacitor may include two electrodes and a dielectric layer disposed therebetween. The capacitor may have various capacities depending on, e.g., a dielectric constant, a thickness of the dielectric layer, an area of the electrodes, and the like.

As the size of a semiconductor chip is reduced, the size of the capacitor therein may also be reduced. However, the smaller capacitor needs sufficient storage capacity. The capacitor may accomplish bigger capacity by, e.g., increasing the vertical area instead of decreasing the horizontal area to increase overall active area. When a capacitor is formed in this way, a composition for a silica-based insulation layer may be used to fill a mold and a gap thereon to form a silica-based insulation layer in order to effectively form an electrode that is relatively high compared with the small horizontal area.

SUMMARY OF THE INVENTION

One embodiment of the present invention provides a composition for a silica-based insulation layer that may form a silica-based insulation layer having excellent thickness uniformity.

Another embodiment of the present invention provides a method of manufacturing a composition for a silica-based insulation layer that may form a silica-based insulation layer having excellent thickness uniformity.

Yet another embodiment of the present invention provides a silica-based insulation layer having excellent thickness uniformity.

Still another embodiment of the present invention provides a method of manufacturing a silica-based insulation layer having excellent thickness uniformity.

One embodiment of the present invention provides a composition for a silica-based insulation layer that includes hydrogenated polysilazane or hydrogenated polysiloxazane, wherein a concentration of a cyclic compound having a weight average molecular weight of less than 400 is less than or equal to 1,200 ppm.

The cyclic compound may be selected from cyclic hydrogenated silazane, cyclic hydrogenated siloxazane, and a mixture thereof.

Specifically, the cyclic compound may be a compound having a structure of the following Chemical Formulae 1a to 1f.

[Chemical Formulae 1a to 1f]

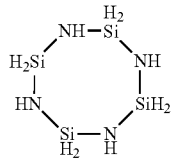

(1a)

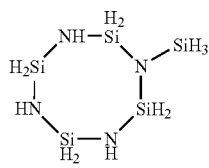

(1b)

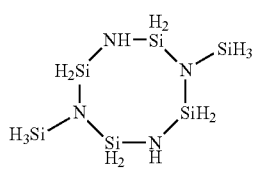

(1c)

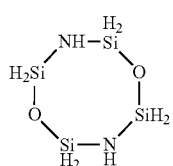

(1d)

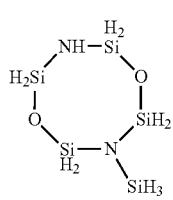

(1e)

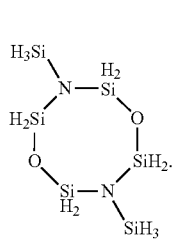

(1f)

The hydrogenated polysilazane or hydrogenated polysiloxazane may have a weight average molecular weight of 1,000 to 7,000.

A content of the hydrogenated polysilazane or hydrogenated polysiloxazane may range from 0.1 to 50 wt %.

Another embodiment of the present invention provides a method of manufacturing a composition for a silica-based insulation layer that includes coammonolyzing a halosilane compound to prepare a solution including hydrogenated polysilazane or hydrogenated polysiloxazane; and substituting a solvent of the solution with a solvent of aromatic hydrocarbons or ethers at 60 to 110° C.

Yet another one embodiment of the present invention provides a silica-based insulation layer manufactured using a composition for a silica-based insulation layer including the hydrogenated polysiloxazane.

The silica-based insulation layer may have a thickness distribution range of less than or equal to 120 nm.

Still another embodiment of the present invention provides a method of manufacturing a silica-based insulation layer that includes applying the above-described composition for a silica-based insulation layer on a substrate; drying the substrate applied with the composition for a silica-based insulation layer; and curing the resultant under an atmosphere including water vapor of greater than or equal to 200° C.

Other embodiments of the present invention will be described in detail.

The composition for a silica-based insulation layer controls a content of a low molecular weight cyclic compound that may have an effect on thickness uniformity of an insulation layer, and therefore a silica-based insulation layer having excellent thickness uniformity may be formed, and thereby generation of film defects after chemical mechanical polishing (CMP) during a semiconductor manufacturing process may be reduced.

DETAILED DESCRIPTION

Hereinafter, embodiments of the present invention are described in detail. However, these embodiments are only exemplary and do not limit the present invention.

A composition for a silica-based insulation layer according to one embodiment of the present invention includes hydrogenated polysilazane or hydrogenated polysiloxazane, wherein a concentration of a cyclic compound having a weight average molecular weight of less than 400 is less than or equal to 1,200 ppm.

When a silica-based insulation layer is formed by applying the composition for a silica-based insulation layer including hydrogenated polysilazane or hydrogenated polysiloxazane on a pattern wafer and then baking the same, a thickness of an insulation layer may be different depending on a position of a pattern wafer due to flows of polymers. When a low molecular weight cyclic compound such as the cyclic hydrogenated silazane, cyclic hydrogenated siloxazane, and the like in the composition for a silica-based insulation layer is controlled within the range, thickness uniformity may be improved.

The cyclic compound may be selected from cyclic hydrogenated silazane, cyclic hydrogenated siloxazane, and a mixture thereof having a weight average molecular weight of less than or equal to 400, and specifically may be selected from monocyclic hydrogenated silazane, bicyclic hydrogenated silazane, monocyclic hydrogenated siloxazane, bicyclic hydrogenated siloxazane, and a mixture thereof having a weight average molecular weight of less than or equal to 400. At least one hydrogen atom in the hydrogenated silazane and hydrogenated siloxazane may be substituted with $SiH_3$ or $NH_2$.

Specifically, the cyclic compound may be a compound having a structure of the following Chemical Formulae 1a to 1f.

[Chemical Formulae 1a to 1f]

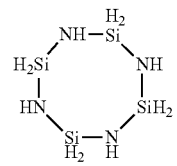

(1a)

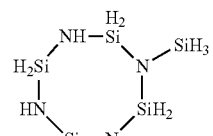

(1b)

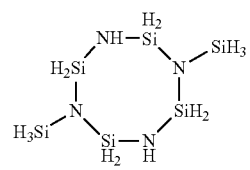

(1c)

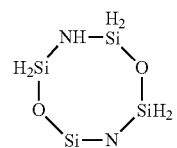

(1d)

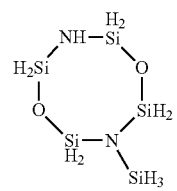

(1e)

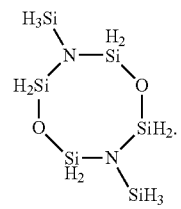

(1f)

The hydrogenated polysilazane or the hydrogenated polysiloxazane may have a weight average molecular weight (Mw) of 1,000 to 7,000. Within the range, evaporation components may be reduced and fine gaps of less than or equal to 50 nm may be filled densely when the composition for a silica-based insulation layer including the hydrogenated polysiloxazane or the hydrogenated polysilazane is heat-treated.

A content of the hydrogenated polysilazane or the hydrogenated polysiloxazane may range from 0.1 to 50 wt %. Within the range, appropriate viscosity may be maintained, and when the composition for a silica-based insulation layer including the hydrogenated polysilazane or the hydrogenated polysiloxazane fills gaps, the silica-based insulation layer may be formed in a smooth and uniform manner without voids.

The composition for a silica-based insulation layer may further include a thermal acid generator (TAG).

The thermal acid generator may be an additive to improve developing property of the hydrogenated polysilazane or the hydrogenated polysiloxazane. The thermal acid generator may make the hydrogenated polysilazane be developed at a relatively low temperature.

The thermal acid generator may include any compound without particular limit, if it generates acid ($H^+$) by heat. In particular, it may include a compound that is activated at 90° C. or higher, generates sufficient acid, and has low volatility. Such the thermal acid generator may be, for example, selected from nitrobenzyl tosylate, nitrobenzyl benzenesulfonate, phenol sulfonate, and a combination thereof.

The thermal acid generator may be included in an amount of about 0.01 to 25 wt % based on the total amount of the composition for a silica-based insulation layer. Within the range, the hydrogenated polysilazane or the hydrogenated polysiloxazane may be developed at a relatively low temperature and simultaneously, have improved coating properties.

The composition for a silica-based insulation layer may further include a surfactant.

The surfactant may include, but is not limited to, polyoxyethylene alkyl ethers such as polyoxyethylene lauryl ether, polyoxyethylene stearyl ether, polyoxyethylene cetyl ether, polyoxyethylene oleyl ether, and the like; polyoxyethylene alkylallyl ethers such as polyoxyethylene nonylphenolether, and the like; polyoxyethylene•polyoxypropylene block copolymers; polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactants such as an organosiloxane polymer KP341 (Shin-Etsu Chemical Co., Ltd.), and the like.

The surfactant may be included in an amount of about 0.001 wt % to 10 wt % based on the total amount of the composition for a silica-based insulation layer. Within the range, dispersion of a solution and simultaneously, uniform thickness of a layer and filling properties thereof are improved.

The composition for a silica-based insulation layer may be a solution where the hydrogenated polysilazane and/or the hydrogenated polysiloxazane and the other components are dissolved in a solvent.

The solvent is not specifically limited as long as it is capable of dissolving the components, and it may include, for example, alcohols such as methanol, ethanol and the like; ethers such as dichloroethyl ether, di-n-butyl ether, diisoamyl ether, methylphenyl ether, tetrahydrofuran and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy alkyl acetate esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate and the like, 2-monooxy monocarboxylic acid alkyl esters of alkoxy-2-methyl alkyl propionate such as 2-methoxy-2-methyl methyl propionate, 2-ethoxy-2-methyl ethyl propionate and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like; and the like. In addition, a solvent having a high boiling point such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetnylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like may be added. Among them, at least one selected from diethylene glycolmonomethylether, diethylene glycoldiethylether, ethyl-3-ethoxy propionate, methyl-3-methoxy propionate, cyclopentanone, cyclohexanone, propylene glycolmonomethyl ether acetate, propylene glycoldimethyletheracetate, 1-methoxy-2-propanol, ethyl lactate, cyclopentanone and ethyl hydroxyacetate ester may be selected.

In one embodiment, the solvent may preferably be at least one solvent having a high boiling point. In this case, the solvent may prevent generation of a void inside a gap when the gap is filled and also, may be slowly volatilized and thus, increase film flatness.

The solvent may be included in a balance amount based on the total weight of the composition for a silica-based insulation layer. The composition for a silica-based insulation layer according to one embodiment of the present invention may be manufactured by coammonolyzing a halosilane compound to prepare a solution including hydrogenated polysilazane or hydrogenated polysiloxazane; and substituting a solvent of the solution with a solvent of aromatic hydrocarbons or ethers at 60 to 110° C.

Hereinafter, each step is described, and first, a halosilane compound is mixed with a solvent and is coammonolyzed to prepare a solution including hydrogenated polysilazane or hydrogenated polysiloxazane.

Preparation of the hydrogenated polysilazane or the hydrogenated polysiloxazane by coammonolysis using the halosilane compound may be performed according to a generally-used method.

When hydrogenated polysilazane is prepared, the solvent is dry pyridine, and when hydrogenated polysiloxazane is prepared, the solvent is dry pyridine and pure water.

The halosilane may be a compound having a structure represented by the following Chemical Formula 4.

$$X_1—(SiY_1Y_2)n—X_2 \qquad \text{[Chemical Formula]}$$

In the above chemical formula, $X_1$ and $X_2$ are each independently a halogen, $Y_1$ and $Y_2$ are each independently hydrogen or a halogen, $X_1$, $X_2$, $Y_1$ and $Y_2$ are the same or different, and n is greater than or equal to 2.

Specifically, the halosilane compound may be, for example, dichlorosilane, trichlorosilane, tetrachlorosilane, or a mixture thereof.

Hydrogenated polysilazane or hydrogenated polysiloxazane synthesized by the coammonolysis reaction may be obtained in a form of a solid in a solution.

Subsequently, a solvent of the solution is substituted with a solvent of aromatic hydrocarbons such as xylene and the like, or ethers such as dibutylether and the like at 60 to 110° C.

The cyclic compound such as cyclic hydrogenated silazane and cyclic hydrogenated siloxazane having a weight average molecular weight of less than or equal to 400 in the solution may be removed through the substitution process within the temperature range.

The cyclic compound is the same as described above, and thus the produced composition for a silica-based insulation layer has a cyclic compound concentration of less than or equal to 1200 ppm.

The composition for a silica-based insulation layer produced according to the method may form a silica-based insulation layer having a uniform thickness range by controlling a concentration of a cyclic compound that may cause thickness non-uniformity. Therefore, it is particularly useful for forming an insulation layer of a device requiring high electrical characteristics such as a semiconductor, liquid crystal, and the like.

A silica-based insulation layer according to another embodiment of the present invention may be manufactured using one of the above-described compositions for a silica-based insulation layer according to one embodiment, and the manufactured silica-based insulation layer has a thickness distribution range of less than or equal to 120 nm.

The method of manufacturing the silica-based insulation layer is not particularly limited, and a generally well-known manufacturing method may be used.

For example, the above-described composition for a silica-based insulation layer is applied on a device substrate such as a semiconductor, a liquid crystal and the like, and dried, and subsequently cured under an atmosphere including water vapor of greater than or equal to 200° C. to form a silica-based insulation layer.

The following examples illustrate the present invention in more detail. However, it is understood that the present invention is not limited by these examples.

COMPARATIVE EXAMPLE 1

A 2 L reactor equipped with an agitator and a temperature controller was internally substituted with dry nitrogen. Subsequently, 1,500 g of dry pyridine was injected into the reactor, and the reactor was kept warm at 5° C. Subsequently, 140 g of dichlorosilane was slowly injected into the reactor for 2 hours, and 85 g of ammonia was slowly injected thereinto for 4 hours, while the reactor was agitated. Subsequently, ammonia remaining in the reactor was removed by injecting dry nitrogen into the reactor for 120 minutes. As a result, the obtained white slurry-phased product was filtered with a 1 μm tetrafluoroethylene (TEFLON) filter under a dry nitrogen atmosphere. Subsequently, 1,000 g of dry xylene was added to 1,000 g of the filtered solution, a rotary evaporator was used to three times repetitively substitute xylene for pyridine and to adjust its solid concentration into 20%, and a TEFLON filter having a pore size of 0.1 μm was used, obtaining a solution including hydrogenated polysilazane. 250 g of dry pyridine was added to the obtained solution including hydrogenated polysilazane and polymerized at 100° C. to have a weight average molecular weight of 4,000. When the polymerization was complete, a rotary evaporator was used to three times repetitively substitute dibutylether for the solvent at 30° C. and to adjust its solid concentration into 20%, and a 0.1 μm TEFLON filter was used to filter the resultant.

The GC/MS analysis result of a finally obtained hydrogenated polysilazane solution showed that the solution included cyclic hydrogenated silazane of a low molecular weight in a concentration of 1,800 ppm and a thickness on a pattern wafer was 200 nm.

COMPARATIVE EXAMPLE 2

A 2 L reactor having an agitator and a temperature controller was internally substituted with dry nitrogen. Subsequently, 1,500 g of dry pyridine was injected into the reactor, and the reactor was kept at 5° C. Subsequently, 140 g of dichlorosilane was slowly injected into the reactor for 2 hours, and 85 g of ammonia was slowly injected thereinto for 4 hours while the reactor was agitated. Subsequently, dry nitrogen was injected into the reactor for 120 minutes to remove ammonia remaining therein. The obtained white slurry-phased product was filtered with a 1 μm TEFLON filter under a dry nitrogen atmosphere. Subsequently, 1,000 g of dry xylene was added to 1,000 g of the filtered solution, the solvent of the mixture was three times repetitively substituted from pyridine to xylene by using a rotary evaporator to adjust its solid concentration into 20% and then, filtered by using a 0.1 μm TEFLON filter, obtaining a solution including hydrogenated polysilazane. 250 g of dry pyridine was added to the obtained solution including hydrogenated polysilazane to perform a polymerization reaction at 100° C. and to prepare a compound having a weight average molecular weight of 4,000.

When the polymerization was complete, the solvent was three times repetitively substituted with dibutylether by using a rotary evaporator at 50° C. to adjust its solid concentration into 20%, and the resultant was filtered by using a 0.1 μm TEFLON filter.

The GC/MS analysis result of a finally obtained hydrogenated polysilazane solution showed that the solution included cyclic hydrogenated silazane of a low molecular weight in a concentration of 1,500 ppm and a thickness on a pattern wafer was 190 nm.

COMPARATIVE EXAMPLE 3

A 2 L reactor having an agitator and a temperature controller was internally substituted with dry nitrogen. Subsequently, 1,500 g of dry pyridine was injected into the reactor, 2 g of pure water was added thereto, and the mixture was kept warm at 5° C. 140 g of dichlorosilane was slowly injected into the reactor for 2 hours, and 85 g of ammonia was slowly injected thereinto for 4 hours, while the reactor was agitated. Subsequently, dry nitrogen was injected into the reactor for 120 minutes to remove ammonia remaining therein. As a result, the obtained white slurry-phased product was filtered by using a 1 µm TEFLON filter under a dry nitrogen atmosphere. Subsequently, 1,000g of dry xylene was added to 1,000 g of the filtered solution, the solvent of the mixture was three times repetitively substituted from pyridine to xylene by using a rotary evaporator to adjust its solid concentration into 20%, and the resultant was filtered by using a TEFLON filter having a pore size of 0.1 µm, obtaining a solution including hydrogenated polysiloxazane. Subsequently, 250 g of dry pyridine was added to the obtained solution including hydrogenated polysiloxazane to perform a polymerization reaction at 100° C. and to prepare a compound having a weight average molecular weight of 4,000.

When the polymerization was complete, the solvent was three times repetitively substituted with dibutylether at 30° C. by using a rotary evaporator to adjust its solid concentration into 20%, and the resultant was filtered by using a 0.1 µm TEFLON filter.

The GC/MS analysis result of a finally obtained hydrogenated polysiloxazane solution showed that the solution included cyclic hydrogenated siloxazane of a low molecular weight in a concentration of 1,700 ppm and a thickness on a pattern wafer was 170 nm.

COMPARATIVE EXAMPLE 4

A 2 L reactor having an agitator and a temperature controller was internally substituted with dry nitrogen. Subsequently, 1,500 g of dry pyridine was injected into the reactor, 2 g of pure water was added thereto, and the mixture was kept warm at 5° C. Subsequently, 140 g of dichlorosilane was slowly injected into the reactor for 2 hours, and 85 g of ammonia was injected thereinto for 4 hours while the reactor was agitated. Subsequently, dry nitrogen was injected into the reactor for 120 minutes to remove ammonia remaining therein. As a result, the obtained white slurry-phased product was filtered by using a 1 µm TEFLON filter under a dry nitrogen atmosphere. Subsequently, 1,000g of dry xylene was added to 1,000 g of the filtered solution, the solvent of the mixture was three times repetitively substituted from pyridine to xylene by using a rotary evaporator to adjust its solid concentration into 20%, and the resultant was filtered by using a 0.1 µm TEFLON filter, obtaining a solution including hydrogenated polysiloxazane. Subsequently, 250 g of dry pyridine was added to the solution including hydrogenated polysiloxazane, and the mixture was polymerized at 100° C. to prepare a compound having a weight average molecular weight of 4,000.

When the polymerization was complete, the solvent was three times repetitively substituted with dibutylether by using a rotary evaporator at 50° C. to adjust its solid concentration into 20%, and the resultant was filtered by using a 0.1 µm TEFLON filter.

The GC/MS analysis result of a finally obtained hydrogenated polysiloxazane solution showed that the solution included cyclic hydrogenated siloxazane of a low molecular weight in a concentration of 1,400 ppm and a thickness on a pattern wafer was 160 nm.

EXAMPLE 1

A 2 L reactor having an agitator and a temperature controller was internally substituted with dry nitrogen. Subsequently, 1,500 g of dry pyridine was injected into the reactor, and the reactor was kept warm at 5° C. Subsequently, 140 g of dichlorosilane was slowly injected into the reactor for 2 hours, and 85 g of ammonia was slowly injected thereinto for 4 hours while the reactor was agitated. Then, ammonia remaining in the reactor was removed by injecting dry nitrogen for 120 minutes thereinto. The obtained white slurry product was filtered by using a 1 µm TEFLON filter under a dry nitrogen atmosphere. Subsequently, 1,000 g of dry xylene is added to 1,000 g of the filtered solution, a solvent in the mixture was three times repetitively substituted from pyridine to xylene by using a rotary evaporator to adjust its solid concentration into 20%, and the resultant was filtered by using a TEFLON filter having a pore size of 0.1 µm, obtaining a solution including hydrogenated polysilazane. Subsequently, 250 g of dry pyridine was added to the obtained solution including hydrogenated polysilazane, and the mixture was polymerized at 100° C. to have a weight average molecular weight of 4,000. When the polymerization was complete, a solvent therein was three times repetitively substituted with dibutylether at 60° C. by using a rotary evaporator to adjust its solid concentration into 20%, and the resultant was filtered by using a 0.1 pm TEFLON filter.

The GC/MS analysis result of a finally obtained hydrogenated polysilazane solution showed that cyclic hydrogenated silazane of a low molecular weight was included in a concentration of 1,200 ppm, and a thickness on a pattern wafer was 120 nm.

EXAMPLE 2

A 2 L reactor equipped with an agitator and a temperature controller was internally substituted with dry nitrogen. Subsequently, 1,500 g of dry pyridine was injected into the reactor, and the reactor was kept warm at 5° C. Subsequently, 140 g of dichlorosilane was slowly injected into the reactor for 2 hours, and 85 g of ammonia was injected into the reactor for 4 hours while the reactor was agitated. Subsequently, dry nitrogen was injected into the reactor for 120 minutes to remove ammonia remaining in the reactor. The obtained white slurry-phased product was filtered by using a 1 µm TEFLON filter under a dry nitrogen atmosphere. Subsequently, 1,000 g of dry xylene was added to 1,000 g of the filtered solution, a solvent therein was three times repetitively substituted from pyridine to xylene by using a rotary evaporator to adjust its solid concentration into 20%, and the resultant was filtered by using a 0.1 µm TEFLON filter, obtaining a solution including hydrogenated polysilazane. Subsequently, 250 g of dry pyridine was added to the solution including hydrogenated polysilazane, and the mixture was polymerized at 100° C. to have a weight average molecular weight of 4,000.

When the polymerization was complete, a solvent therein was three times repetitively substituted with dibutylether at 70° C. by using a rotary evaporator to adjust its solid concentration into 20%, and the resultant was filtered by using a 0.1 pm TEFLON filter. The GC/MS analysis result of a finally obtained hydrogenated polysilazane solution showed that cyclic hydrogenated silazane of a low molecular weight was included in a concentration of 1,000 ppm, and a thickness on a pattern wafer was 90 nm.

EXAMPLE 3

A 2 L reactor equipped with an agitator and a temperature controller was internally substituted with dry nitrogen. Subsequently, 1,500 g of dry pyridine was injected into the reactor, and then, the reactor was kept warm at 5° C.

Subsequently, 140 g of dichlorosilane was slowly injected into the reactor for 2 hours, and 85 g of ammonia was slowly injected into the reactor for 4 hours. Subsequently, dry nitrogen was injected into the reactor for 120 minutes to remove ammonia remaining therein. The obtained white slurry-phased product was filtered by using a 1 μm TEFLON filter under a dry nitrogen atmosphere. Subsequently, 1,000 g of dry xylene was added to 1,000 g of the filtered solution, a solvent in the mixture was three times repetitively substituted from pyridine to xylene by using a rotary evaporator to adjust its solid concentration into 20%, and the resultant was filtered by using a TEFLON filter having a pore size of 0.1 μm, obtaining a solution including hydrogenated polysilazane. Subsequently, 250 g of dry pyridine was added to the solution including hydrogenated polysilazane, and the mixture was polymerized at 100° C. to have a weight average molecular weight of 4,000.

When the polymerization was complete, a solvent therein was three times repetitively substituted with dibutylether at 90° C. by using a rotary evaporator to adjust its solid concentration into 20%, and the resultant was filtered by using a 0.1 μm TEFLON filter.

The GC/MS analysis result of a finally obtained hydrogenated polysilazane solution showed that cyclic hydrogenated silazane of a low molecular weight was included in a concentration of 700 ppm, and a thickness on a pattern wafer was 50 nm.

EXAMPLE 4

A 2 L reactor having an agitator and a temperature controller was internally substituted with dry nitrogen. Subsequently, 1,500 g of dry pyridine was injected into the reactor, and the reactor was kept warm at 5° C. Subsequently, 140 g of dichlorosilane was slowly injected into the reactor for 2 hours, and 85 g of ammonia was slowly injected into the reactor for 4 hours while the reactor was agitated. Subsequently, dry nitrogen was injected into the reactor for 120 minutes to remove ammonia remaining in the reactor. The obtained white slurry-phased product was filtered by using a 1 μm TEFLON filter under a dry nitrogen atmosphere. Subsequently, 1,000 g of dry xylene was added to 1,000 g of the filtered solution, and the solvent therein was three times repetitively substituted from pyridine to xylene by using a rotary evaporator to adjust its solid concentration into 20%, and the resultant was filtered by using a TEFLON filter having a pore size of 0.1 μm, obtaining a solution including hydrogenated polysilazane. Subsequently, 250 g of dry pyridine was added to the solution including hydrogenated polysilazane, and the mixture was polymerized at 100° C. to have a weight average molecular weight of 4,000.

When the polymerization was complete, a solvent therein was three times repetitively substituted at 110° C. with dibutylether by using a rotary evaporator to adjust its solid concentration into 20%, and the resultant was filtered with a 0.1 μm TEFLON filter.

The GC/MS analysis result of a finally obtained hydrogenated polysilazane solution showed that cyclic hydrogenated silazane of a low molecular weight was included in a concentration of 400 ppm, and a thickness on a pattern wafer was 40 nm.

EXAMPLE 5

A 2 L reactor having an agitator and a temperature controller was internally substituted with dry nitrogen. Subsequently, 1,500 g of dry pyridine was injected into the reactor, 2 g of pure water was added thereto, and the reactor was kept warm at 5° C. 140 g of dichlorosilane was slowly injected into the reactor for 2 hours, and 85 g of ammonia was slowly injected thereinto for 4 hours while the reactor was agitated. Subsequently, dry nitrogen was injected into the reactor for 120 minutes to remove ammonia remaining in the reactor.

The obtained white slurry-phased product was filtered by using a 1 μm TEFLON filter under a dry nitrogen atmosphere. After 1,000 g of dry xylene was added to 1,000 g of the filtered solution, a solvent therein was three times repetitively substituted from pyridine to xylene by using a rotary evaporator to adjust its solid concentration into 20%, and the resultant was filtered by using a 0.1 μm TEFLON filter, obtaining a solution including hydrogenated polysiloxazane. Subsequently, 250 g of dry pyridine was added to the solution including hydrogenated polysiloxazane, and the mixture was polymerized at 100° C. to have a weight average molecular weight of 4,000.

When the polymerization was complete, the solvent was substituted with dibutylether at 60° C. by using a rotary evaporator to adjust its solid concentration into 20%, and the resultant was filtered by using a 0.1 μm TEFLON filter.

The GC/MS analysis result of a finally obtained hydrogenated polysiloxazane solution showed that cyclic hydrogenated siloxazane of a low molecular weight was included in a concentration of 1,200 ppm, and a thickness on a pattern wafer was 110 nm.

EXAMPLE 6

A 2 L reactor having an agitator and a temperature controller was internally substituted with dry nitrogen. Subsequently, 1,500 g of dry pyridine was injected into the reactor, 2 g of pure water was added thereto, and the reactor was kept warm at 5° C. 140 g of dichlorosilane was slowly injected into the reactor for 2 hours, 85 g of ammonia was slowly injected thereinto for 4 hours while the agitator was agitated. Subsequently, dry nitrogen was injected into the reactor for 120 minutes to remove ammonia remaining therein. The obtained white slurry-phased product was filtered by using a 1 μm TEFLON filter under a dry nitrogen atmosphere. Subsequently, 1,000 g of dry xylene was added to 1,000 g of the filtered solution, a solvent therein was three times repetitively substituted from pyridine to xylene by using a rotary evaporator to adjust its solid concentration into 20%, and the resultant was filtered by using a TEFLON filter having a pore size of 0.1 μm, obtaining a solution including hydrogenated polysiloxazane. 250 g of dry pyridine was added to the solution including hydrogenated polysiloxazane, and the mixture was polymerized at 100° C. to have a weight average molecular weight of 4,000.

When the polymerization was complete, the solvent was three times repetitively substituted with dibutylether at 70° C. to adjust its solid concentration into 20%, and the resultant was filtered by using a 0.1 μm TEFLON filter.

The GC/MS analysis result of a finally obtained hydrogenated polysiloxazane solution showed that cyclic hydrogenated siloxazane of a low molecular weight was included in a concentration of 900 ppm, and a thickness on a pattern wafer was 70 nm.

EXAMPLE 7

A 2 L reactor having an agitator and a temperature controller was internally substituted with dry nitrogen. Subsequently, 1,500 g of dry pyridine was injected into the reactor, 2 g of pure water was added thereto, and the mixture was kept warm at 5° C. Subsequently, 140 g of dichlorosilane was slowly injected into the reactor for 2 hours, and 85 g of ammonia was injected thereinto for 4 hours while the reactor was agitated. Subsequently, dry nitrogen was injected into the reactor for 120 minutes to remove ammonia remaining therein. The obtained white slurry-phased product was filtered by using a 1 μm TEFLON filter under a dry nitrogen atmosphere. Subsequently, 1,000 g of dry xylene was added to 1,000 g of the filtered solution, a solvent therein was three times repetitively substituted from pyridine to xylene by using a rotary evaporator to adjust its solid concentration into 20%, and the resultant was filtered by using a TEFLON filter having a pore size of 0.1 μm, obtaining a solution including hydrogenated polysiloxazane. Subsequently, 250 g of dry pyridine was added to the obtained solution including hydrogenated polysiloxazane, and the mixture was polymerized at 100° C. to have a weight average molecular weight of 4,000.

When the polymerization was complete, the solvent was three times repetitively substituted with dibutylether at 90° C. by using a rotary evaporator to adjust its solid concentration into 20%, and the resultant was filtered by using a 0.1 μm TEFLON filter.

The GC/MS analysis result of a finally obtained hydrogenated polysiloxazane solution showed that cyclic hydrogenated siloxazane of a low molecular weight was included in a concentration of 700 ppm, and a thickness on a pattern wafer was 40 nm.

EXAMPLE 8

A 2 L reactor having an agitator and a temperature controller was internally substituted with dry nitrogen. Subsequently, 1,500 g of dry pyridine was injected into the reactor, 2 g of pure water was added thereto, and the mixture was kept warm at 5° C. Subsequently, 140 g of dichlorosilane was injected into the reactor for 2 hours, and 85 g of ammonia was injected thereinto for 4 hours while the reactor was agitated. Subsequently, dry nitrogen was injected into the reactor for 120 minutes to remove ammonia remaining therein. The obtained white slurry-phased product was filtered by using a 1 μm TEFLON filter under a dry nitrogen atmosphere. Subsequently, 1,000 g of dry xylene was added to 1,000 g of the filtered solution, the solvent of the mixture was three times repetitively substituted from pyridine to xylene by using a rotary evaporator to adjust its solid concentration into 20%, and the resultant was filtered by using a 0.1 μm TEFLON filter, obtaining a solution including hydrogenated polysiloxazane. Subsequently, 250 g of dry pyridine was added to the obtained solution including hydrogenated polysiloxazane, and the mixture was polymerized at 100° C. to have a weight average molecular weight of 4,000.

When the polymerization was complete, the solvent was three times repetitively substituted with dibutylether at 110° C. to adjust its solid concentration into 20%, and the resultant was filtered by using a 0.1 μm TEFLON filter.

The GC/MS analysis result of a finally obtained hydrogenated polysiloxazane solution showed that cyclic hydrogenated siloxazane of a low molecular weight was included in a concentration of 300 ppm, and a thickness on a pattern wafer was 40 nm.

The hydrogenated polysilazane or hydrogenated polysiloxazane-containing solutions according to Comparative Examples 1 to 4 and Examples 1 to 8 were measured for the weight average molecular weight of hydrogenated polysilazane or hydrogenated polysiloxazane, the amount of cyclic hydrogenated silazane or hydrogenated siloxazane, and thickness of a wafer formed thereof.

An analysis method and an evaluation apparatus below were used.

Contents of cyclic hydrogenated silazane and cyclic hydrogenated siloxazane:
Injector: 7683 Series (Agilent Technologies Inc.) Measurement condition: inlet temperature: 280° C., split ratio=40:1, injection amount: 1 μL
Oven: 6890N (Agilent Technologies Inc.)
Condition: column: DB-5HT, column flow: 1 mL/min,
Oven temperature program: 40° C. 3 minutes-10° C./min→280° C. 10 minutes
MSD: 5973N (Agilent Technologies Inc.)
Condition: MS interface temp.: 280° C.
Weight average molecular weight:
GPC made by Waters Co.; HPLC Pump 1515, RI Detector 2414
Column made by Shodex; KF801, KF802, KF803
Wafer thickness range
K-spin 8 coater, 1,500rpm, 21 Point measurement
Thickness measuring device: an optical thickness measuring device (K-MAC®)
The results are provided in the following Table 1.

TABLE 1

| | Solvent substituted temperature (° C.) | weight average molecular weight | Amount of cyclic hydrogenated silazane or hydrogenated siloxazane (ppm) | Wafer thickness distribution range (nm) |
|---|---|---|---|---|
| Comparative Example 1 | 30 | 4,000 | 1,800 | 200 |
| Comparative Example 2 | 50 | 4,000 | 1,500 | 190 |
| Comparative Example 3 | 30 | 4,000 | 1,700 | 170 |
| Comparative Example 4 | 50 | 4,000 | 1,400 | 160 |
| Example 1 | 60 | 4,000 | 1,200 | 120 |
| Example 2 | 70 | 4,000 | 1,000 | 90 |
| Example 3 | 90 | 4,100 | 700 | 50 |
| Example 4 | 110 | 4,100 | 400 | 40 |
| Example 5 | 60 | 4,000 | 1,200 | 110 |
| Example 6 | 70 | 4,000 | 900 | 70 |
| Example 7 | 90 | 4,100 | 700 | 40 |
| Example 8 | 110 | 4,100 | 300 | 40 |

As shown in Table 1, the polysiloxazane or polysilazane-containing solution having a lower cyclic compound concentration according to Examples 1 to 8 had a sharply decreased thickness compared with the solutions according to Comparative Examples 1 to 3.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A composition for a silica-based insulation layer, the composition comprising:
a hydrogenated polysilazane or a hydrogenated polysiloxazane, wherein a concentration of a cyclic compound having a weight average molecular weight of less than 400 in the composition is less than or equal to 1200 ppm.

2. The composition for a silica-based insulation layer of claim 1, wherein the cyclic compound is selected from cyclic hydrogenated silazane, cyclic hydrogenated siloxazane, and a mixture thereof.

3. The composition for a silica-based insulation layer of claim 1, wherein the cyclic compound is a compound having a structure selected from one of the following Chemical Formulae 1a to 1f:

[Chemical Formulae 1a to 1f]

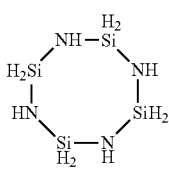
(1a)

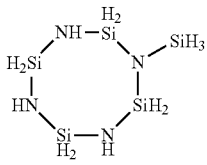
(1b)

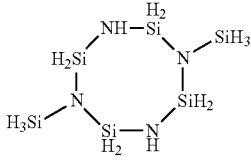
(1c)

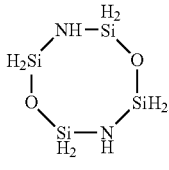
(1d)

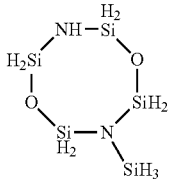
(1e)

-continued

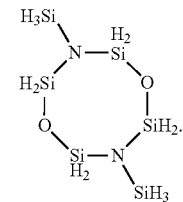
(1f)

4. The composition for a silica-based insulation layer of claim 1, wherein the hydrogenated polysilazane or the hydrogenated polysiloxazane has a weight average molecular weight of 1,000 to 7,000.

5. The composition for a silica-based insulation layer of claim 1, wherein a content of the hydrogenated polysilazane or the hydrogenated polysiloxazane in the composition ranges from 0.1 to 50 wt %, based on a total weight of the composition.

6. A method of manufacturing the composition of claim 1 for a silica-based insulation layer, the method comprising:
coammonolyzing a halosilane compound to prepare a solution that includes a hydrogenated polysilazane or a hydrogenated polysiloxazane; and
substituting a solvent of the solution with a solvent that includes an aromatic hydrocarbon or ether, at 60 to 110° C.

7. A silica-based insulation layer manufactured using the composition for a silica-based insulation layer comprising the hydrogenated polysiloxazane as claimed in claim 1 by:
applying the composition for a silica-based insulation layer on a substrate;
drying the substrate applied with the composition for a silica-based insulation layer; and
curing the resultant under an atmosphere comprising water vapor at a temperature of greater than or equal to 200° C.

8. The silica-based insulation layer of claim 7, wherein the silica-based insulation layer has a thickness distribution range of less than or equal to 120 nm.

9. A method of manufacturing a silica-based insulation layer, comprising:
applying the above-described composition for a silica-based insulation layer as claimed in claim 1, on a substrate;
drying the substrate applied with the composition for a silica-based insulation layer; and
curing the resultant under an atmosphere comprising a water vapor at a temperature of of greater than or equal to 200° C.

* * * * *